United States Patent
Breham et al.

(10) Patent No.: US 10,955,512 B2
(45) Date of Patent: Mar. 23, 2021

(54) EPR APPARATUS EQUIPPED WITH SPECIFIC RS COILS AND CORRESPONDING COIL DEVICES

(71) Applicant: Bruker France SAS, Wissembourg (FR)

(72) Inventors: Sébastien Breham, Wissembourg (FR); Frédéric Jaspard, Wahlenheim (FR); Eric Beyer, Eberbach-Seltz (FR)

( * ) Notice: Subject to any disclaimer, the term of this patent is extended or adjusted under 35 U.S.C. 154(b) by 0 days.

(21) Appl. No.: 16/923,457

(22) Filed: Jul. 8, 2020

(65) Prior Publication Data

US 2021/0011106 A1    Jan. 14, 2021

(30) Foreign Application Priority Data

Jul. 11, 2019 (EP) ..................... 19315067

(51) Int. Cl.
*G01R 33/60* (2006.01)
*G01N 24/10* (2006.01)

(52) U.S. Cl.
CPC ............. *G01R 33/60* (2013.01); *G01N 24/10* (2013.01)

(58) Field of Classification Search
CPC ................................ G01R 33/60; G01N 24/10
USPC ......................................................... 324/316
See application file for complete search history.

(56) References Cited

U.S. PATENT DOCUMENTS

| | | | |
|---|---|---|---|
| 10,564,308 B1 * | 2/2020 | Godoy | ............ G01N 24/10 |
| 2011/0109313 A1 | 5/2011 | Subramanian | |
| 2012/0262176 A1 | 10/2012 | Tomasz | |

FOREIGN PATENT DOCUMENTS

EP    3339872 A1    6/2018

OTHER PUBLICATIONS

Yokoyama et al. "A Spatiotemporal Study on the Distribution of Intraperitoneally Injected Nitroxide Radical in the Rat Head Using an in Vivo ESR Imaging System"; 1996; Magnetic Resonance Imaging; vol. 14 No. 5; pp. 559-563 (Year: 1996).*
Oikawa et al. "Rapid Field Scan L-Band Electron Spin Resonance Computed Tomography System Using an Air-Core Electromagnet"; 1995; Analytical Sciences; vol. 11; pp. 885-888 (Year: 1995).*

(Continued)

*Primary Examiner* — Melissa J Koval
*Assistant Examiner* — Rahul Maini
(74) *Attorney, Agent, or Firm* — Benoit & Côté Inc.

(57) ABSTRACT

An electron paramagnetic resonance (EPR) apparatus, such as an EPR spectrometer or an EPR imager, comprising a main field magnet with two opposed pole pieces defining an airgap between them, a microwave resonator coupled with a microwave guide, a sample holder and a current source adapted to be used as a coil driver, also comprises a rapid scan (RS) coil assembly with two opposed RS coil devices. Each coil device comprises: i) a coil support having a plate like body and comprising recesses designed to accommodate the at least one coil winding and at least one cooling chamber volume which is connected to cooling liquid supply channels; and ii) RF shielding comprising an electrically conducting, non-magnetic, shielding plate which is mounted laterally onto the coil support, between the coil winding(s) and a corresponding pole piece of the main field magnet, and contacts the cooling chamber volume.

15 Claims, 7 Drawing Sheets

(56) References Cited

OTHER PUBLICATIONS

Samouilov et al. "Development of a fast-scan EPR imaging system for highly accelerated free radical imaging"; Mar. 11, 2019; Magnetic Resonance in Medicine; vol. 82; pp. 842-853 (Year: 2019).*
Quine et al., "A Resonated Coil Driver for Rapid Scan EPR"; R.W.; Concepts in Magnetic Resonance Part B (Magnetic Resonance Engineering); vol. 41B (4) 9-110 (2012); Wiley Periodicals, Inc.
Rinard, G. et al. "A Wire-crossed-loop resonator for rapid scan EPR", Concepts in Magnetic Resonance Engineering, vol. 37B, No. 2, Apr. 2010.
Tseytlin, Oxana et al. "Modular imaging system: Rapid scan EPR at 800 MHz", Journal of Magnetic Resonanace, Academic Press, Orlando, FL, U.S.A., vol. 305, Jun. 8, 2019.
Goldberg, Ira et al., "High modulation amplitude modification for Varian ESR spectrometers", Review of Scientific Instruments, vol. 45. No. 6, Jun. 1974.

* cited by examiner

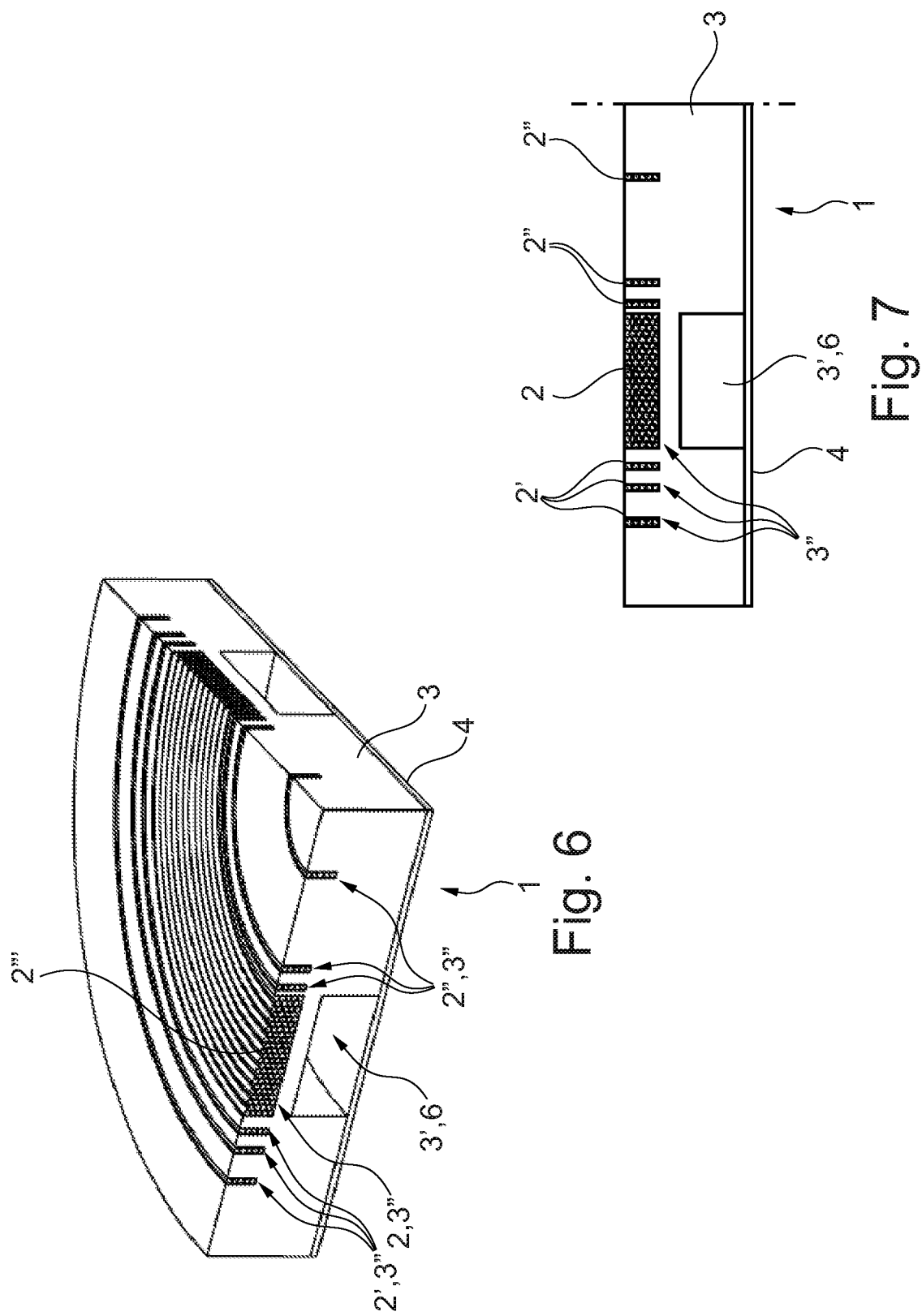

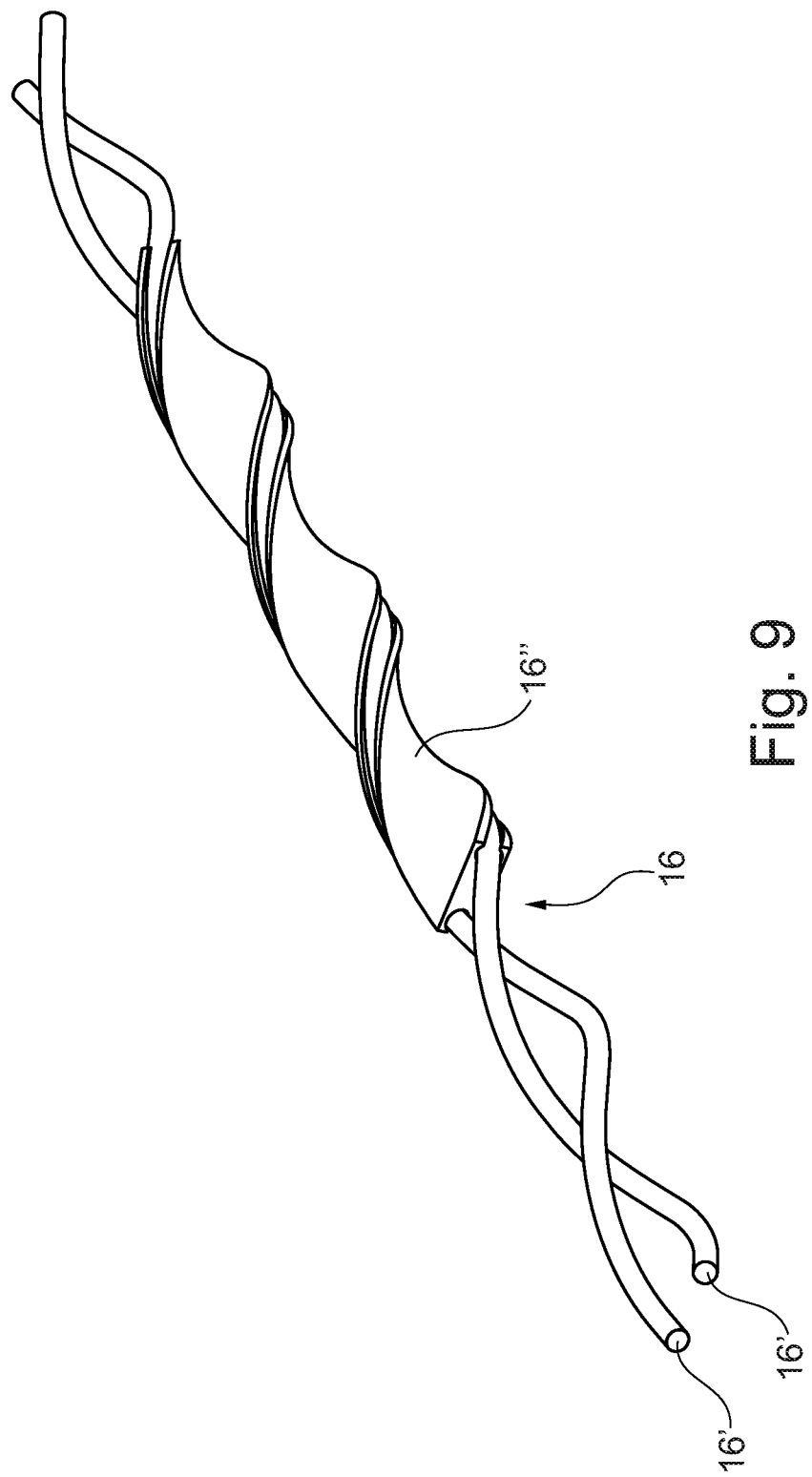

EPR APPARATUS EQUIPPED WITH SPECIFIC RS COILS AND CORRESPONDING COIL DEVICES

BACKGROUND OF THE INVENTION

Field of the Invention

The present invention is related to the field of non-invasive and non-destructive analysis and imaging using Electron Paramagnetic Resonance (EPR), more particularly so-called Rapid Scan EPR (RS EPR) and concerns more specifically an EPR apparatus equipped with specific RS coils and corresponding coil devices.

Description of the Related Art

RS EPR is an alternative method for recording spectra to Continuous Wave EPR (CW-EPR) and pulsed EPR.

An example of an EPR imaging device using the RS technique is disclosed in US 2012/0262176. Although the shown apparatus comprises gradient coils for the space-encoding, it can also be used without such coils as an EPR spectrometer.

Furthermore, a known CW-EPR spectrometer is manufactured and sold by the applicant under the trade name ELEXSYS.

The major advantage of RS EPR is a sensitivity gain up to a factor of 2-250 compared to conventional CW-EPR, depending on sample conditions (i.e. type of sample, relaxation times, temperature, etc.). Due to the high speed at which the field transits through resonance, the signal is saturating at much higher microwave power than in conventional CW-EPR. Thus, the higher the used microwave power, the larger the signal amplitude.

A further advantage of this method is a fast detection which greatly improves the ability to record time resolved snap shots of entire EPR spectra.

A typical RS-EPR system layout comprises a magnet for producing a permanent magnetic Bo field, a dedicated microwave EPR resonator, a microwave emitter, a microwave receiver with an acquisition module and a set of dynamic coils driven by an electronic amplifier.

In the RS-EPR method, the spectra are measured under an alternating magnetic field. Field amplitude and phase stability are of crucial importance for the quality of the measurements.

The RS coil driver operates in two distinct modes: resonant and non-resonant modes.

In resonant mode the coils are driven by a sinusoidal signal in combination (series) within dedicated capacitors which reduce the amplitude of the driven voltage. Resonant circuits are generally used for higher scan rates, but this case is limited to sinusoidal scans, for which sinusoidal deconvolution of spectra must be used (see for example: "A Resonated Coil Driver for Rapid Scan EPR"; R. W. Quine et al.; Concepts in Magnetic Resonance Part B (Magnetic Resonance Engineering); Vol. 41B (4) 9-110 (2012); Wiley Periodicals, Inc.).

Non-resonant mode is limited to lower scan rates but allows using arbitrary current wave shapes, in particular a triangular one, with constant scan rate, and accepts simpler deconvolution procedure.

The recorded spectrum shows the electromagnetic energy absorbed by the sample versus magnetic field.

When dealing with the design of rapid scan coils for use in RS-EPR procedures and apparatuses, several issues must be taken into consideration, as exposed hereinafter.

To obtain spectra of suitable quality, the field of the main magnet (producing the Bo field) must be stable in time and highly homogeneous spatially in the vicinity of the sample. Usually, main magnet parts are made of ferromagnetic and electrically conductive materials which means that the RS coils must be magnetically and thermally decoupled from the magnet to avoid perturbation of the main field by induced Eddy currents or thermal effects (magnetic drift which induces shift of EPR resonance frequency).

The design of the RS coils must be such, in terms of shape, size and compactness, that it can fit inside the magnet air gap (i.e.: between the pole pieces of the main magnet) and provide access and space to position the microwave resonator containing the sample and the optional cryogenic cooling unit.

In an EPR apparatus as mentioned before, the microwave resonator can be dedicated for RS setup and therefore designed to be transparent for RF fields in the range between 1 kHz and 200 kHz, preferably between 6 kHz and 100 kHz. This is achieved by producing the resonator body with a thin wire wound as solenoid which is closely packed for avoiding microwave leakage out of the resonator. The wire diameter is chosen to be lower than the skin depth of maximum RF frequency range of interest (see for example: EP 3 339 872 A1).

RS coils should be able to deliver a magnetic field with the following performances:
 a. Maximum amplitude in the range of 200 G peak-to-peak (20 mT peak-to-peak),
 b. High field homogeneity in the full sample volume (better than 0.5%).

To limit RS coil operating voltage and simplify coil driving, RS coils impedance should be as low as possible and linear versus frequency.

RS coils must be able to withstand high operating voltage (in the range of 1000 Vrms).

Due to Lorentz forces, the RS coils can create important acoustic noise when used in the acoustic frequency domain (20 Hz-20000 Hz). To respect regulations and minimize user discomfort, RS coils design should minimize acoustic noise.

Due to magnetic transparency, no ferromagnetic parts, components or particles can be used in the coil device, as such parts or particles would deteriorate the homogeneity of the static magnetic field.

Now, to summarize, the following limitations can be noted in the prior art when considering the existing EPR apparatuses equipped with RS coils:
 The coils are not designed to be thermally and magnetically decoupled from the main magnet or its pole pieces;
 The coils are not designed to prevent heat transmission to the microwave resonator (N.B.: the resonance frequency of said resonator is very sensitive to temperature drift and designed to be transparent for RF fields produced by the RS coils);
 Heat management and acoustic noise issues are generally not specifically considered;
 Management of high operating voltage (dielectric insulation) is not sufficiently considered;
 Mechanical system integration (access and space) with other RS components (resonator, cryocooling, . . . ) is not optimized;
 Field homogeneity is generally not considered over the full cylindrical sample volume;

Coil topology is not optimized for low and linear impedance and leads to:
use of several coils for a broadband frequency range
poor winding filling factor
poor manufacturing reproducibility
poor magnetic efficiency.

SUMMARY OF THE INVENTION

The invention provides an EPR apparatus equipped with an RS coil assembly which allows to overcome at least the main aforementioned limitations.

To that end, the present invention concerns, according to a first and main aspect, an EPR apparatus, such as an EPR spectrometer or an EPR imager, mainly comprising a main magnet with two opposed pole pieces defining an airgap between them, an RS coil assembly comprising two opposed RS coil devices having each at least one coil winding, a microwave resonator coupled with a microwave guide, a sample holder, holding the sample to be analyzed, as well as a current source adapted to be used as a coil driver.

The apparatus is characterized in that each of the two opposed RS coil devices comprises:
 i) a coil support means having a plate like body and comprising recesses designed to accommodate the at least one coil winding and at least one cooling chamber volume which is connected to cooling liquid supply channels, and
 ii) a coil field shielding means comprising an electrically conducting, non-magnetic, shielding plate which is mounted laterally onto the coil support means, between the coil winding(s) and the corresponding pole piece of the main field magnet, and contacts said cooling chamber volume.

BRIEF DESCRIPTION OF THE DRAWINGS

The invention will be better understood, thanks to the following description, which refers to preferred embodiments, given as nonrestrictive examples, and explained with reference to the attached schematic drawings, in which:

FIG. 6 is a partial sectional view along two mutually perpendicular planes of a RS coil device according to a second embodiment of the invention;

FIG. 7 is a side elevational view of the item of FIG. 6;

FIG. 9 is a partial perspective view of a power or feeding cable for a RS coil device according to the invention, with its outer coating removed.

DETAILED DESCRIPTION

Figure 1:
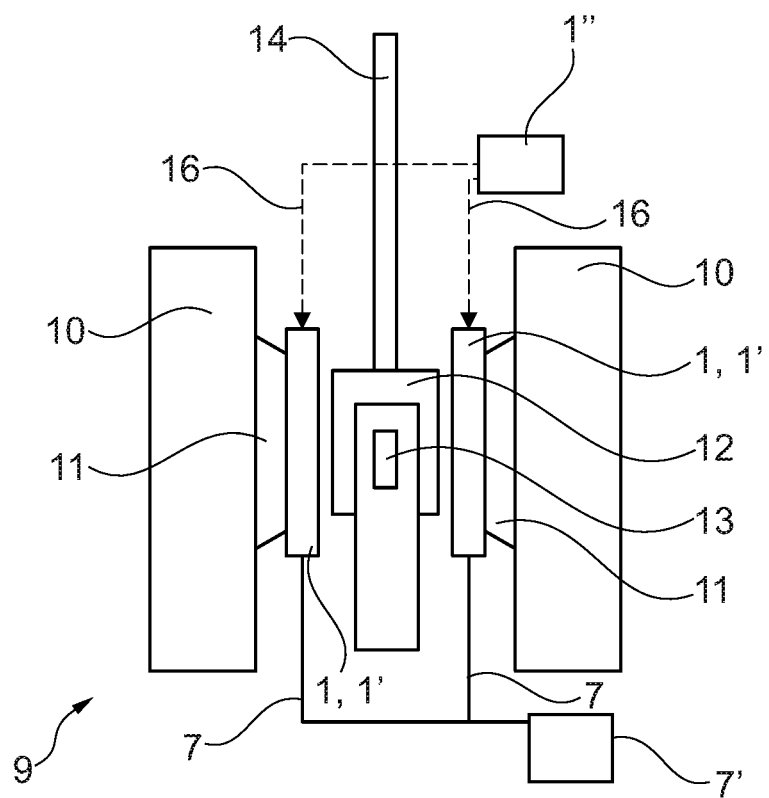
FIG. 1 is a schematic drawing of the main components of an EPR apparatus according to the invention.

The invention concerns, as shown schematically in FIG. 1, an Electron Paramagnetic Resonance apparatus 9, such as an EPR spectrometer or an EPR imager, mainly comprising a main field magnet 10 with two opposed pole pieces 11 defining an airgap between them, an RS coil assembly 1' comprising two opposed RS coil devices 1 having each at least one coil winding 2, 2', 2", a microwave resonator 12 coupled with a microwave guide 14, a sample holder, holding the sample 13 to be analyzed, as well as a current source 1" adapted to be used as a coil driver.

Figure 2:
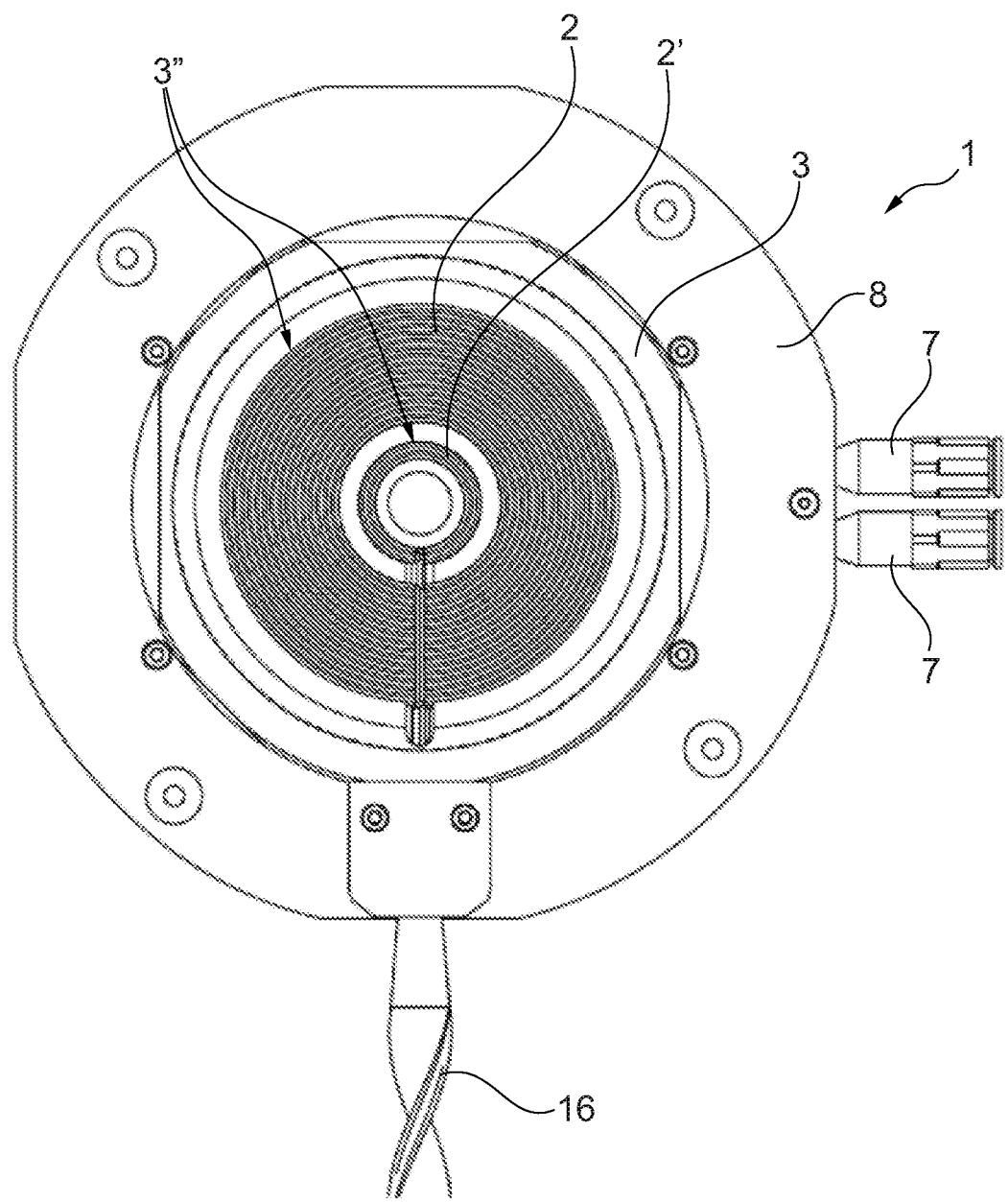
FIG. 2 is a side elevational view of a RS coil device according to a first embodiment of the invention.
Figure 3:
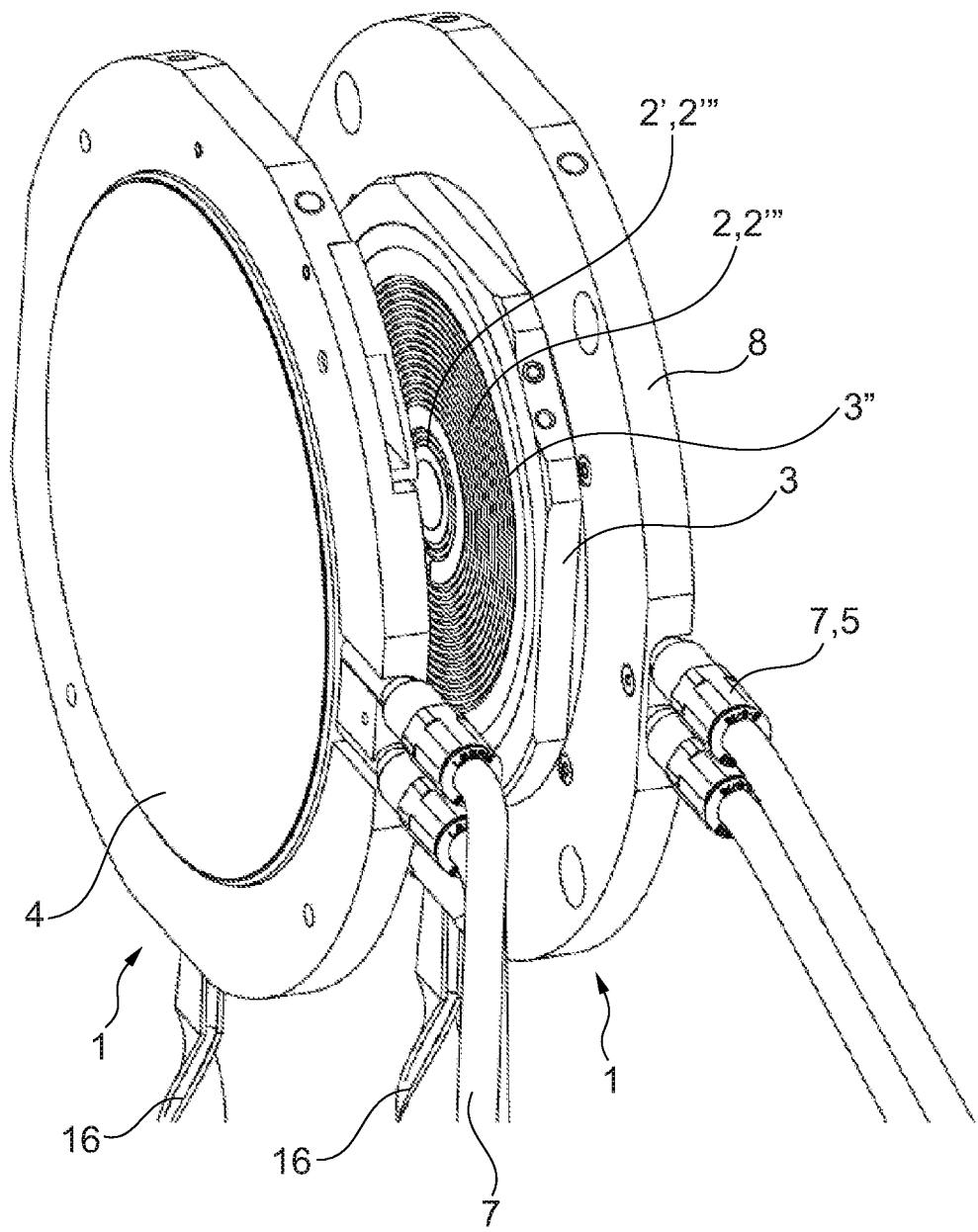
FIG. 3 is a perspective view of an arrangement of a pair of RS coil devices positioned as is the EPR apparatus of FIG. 1.
Figure 4:
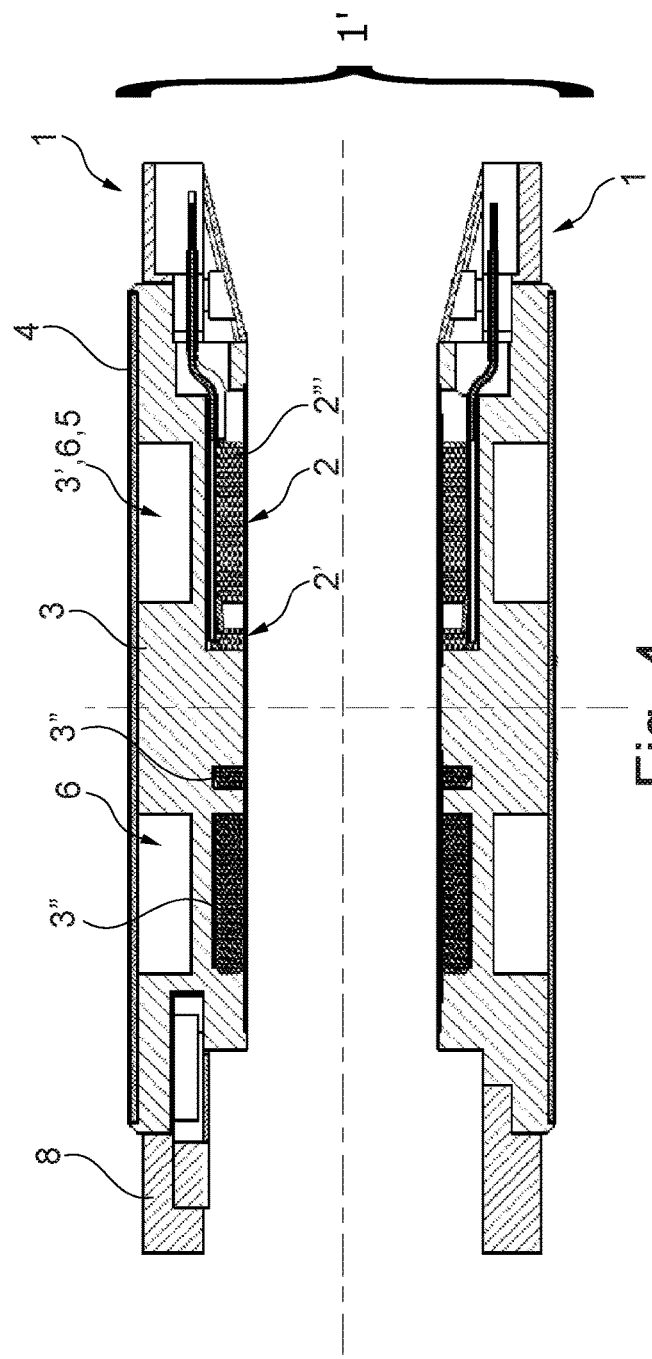
FIG. 4 is a sectional view along a transversal plane containing the central axis of the pair of coil devices shown in FIG. 3.
Figure 5:
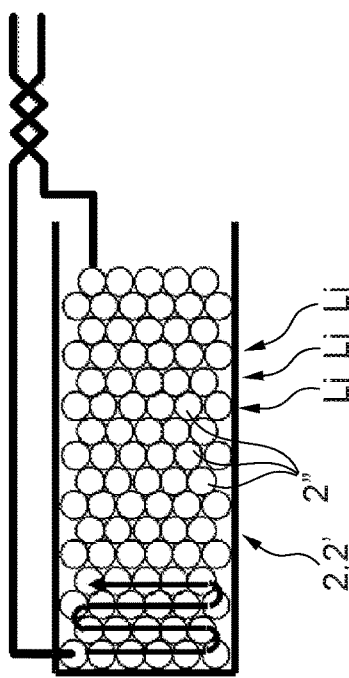
FIG. 5 is a partial sectional view at a different scale of a possible embodiment of a winding belonging to a coil device as shown in FIGS. 3 and 4.
Figure 8:
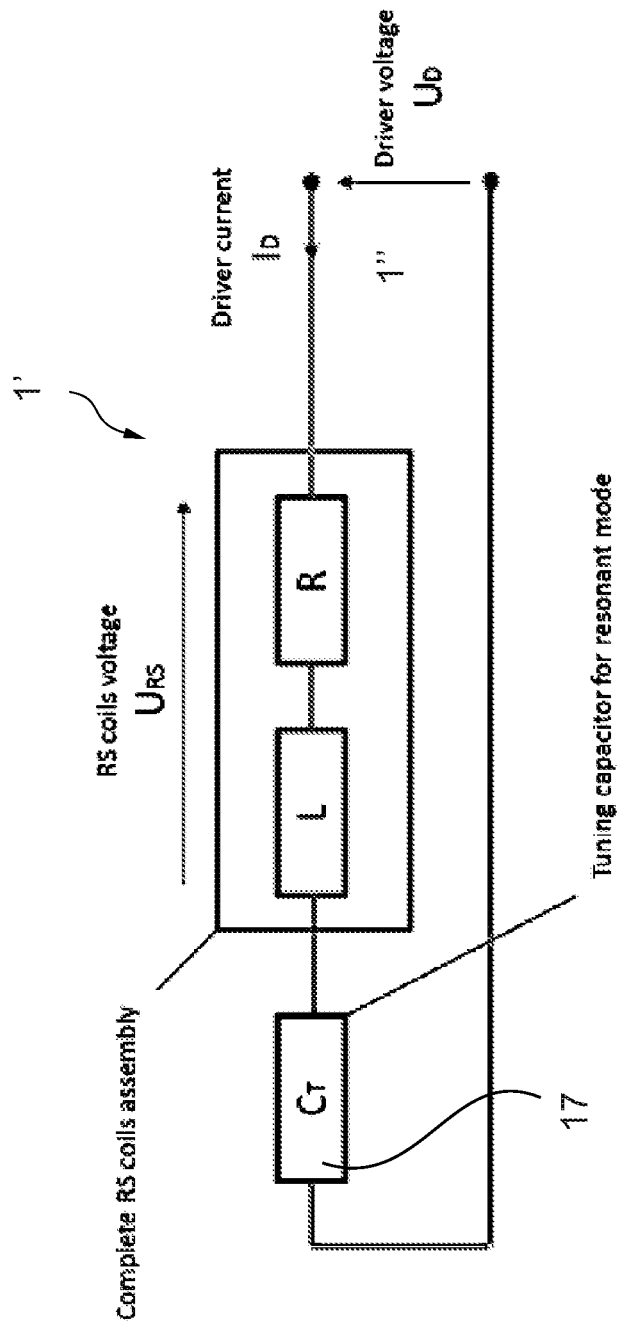
FIG. 8 is a synoptic drawing of an electrical circuit setup with capacitors in series for driving a RS coil device according to the invention in resonant mode.

As illustrated by way of example in FIGS. 2 to 4, said apparatus 9 is characterized in that each of the two opposed RS coil devices 1 comprises:
 i) a coil support means 3 having a plate like body and comprising recesses 3', 3" designed to accommodate the at least one coil winding 2, 2', 2" and at least one cooling chamber 6 volume which is connected to cooling liquid supply channels 7, and
 ii) an RF shielding means 4 comprising an electrically conducting, non-magnetic, shielding plate which is mounted laterally onto the coil support means 3, between the coil winding(s) 2, 2', 2" and the corresponding pole piece 11 of the main field magnet 10, and contacts said cooling chamber volume 6.

Thanks to the previously mentioned technical features, the invention is able to provide an RS coil assembly 1' composed of two RS coil devices 1 which are structurally highly integrated and show a reduced dimension in the direction of the width of the magnet airgap. Furthermore, the coil winding(s) 2, 2', 2" is (are) thermally and magnetically decoupled from the main magnet 10 and the pole pieces 11, and are prevented from heating up and thus the main magnetic Bo field is not subject to a magnetic drift and will remain with a high homogeneity of the magnetic field in the volume of interest (in the airgap). Moreover, any heat transfer to other parts in the airgap such as the resonator 12 or the sample 13 becomes insignificant. For example, the cooling means 5 comprising the at least one cooling chamber 6 and the coolant supply channels 7 may be sized and configured so that the coil device 1 surface does not exceed 30° or 35° C.

Indeed, the Eddy currents generated in the plate 4 allow this latter to act as a passive magnetic shield between the coil winding(s) 2, 2', 2" and the main magnet 10 or the pole pieces 11. In addition, as said plate 4 is in direct contact with the coil coolant, it will stay cool and thermally decoupled from any component in its vicinity.

As a favorable measure towards compactness of the device 1, the invention may provide that each coil support means 3 has a disc shaped body and that the or each cooling chamber volume consists of a circular or annular recess, closed by the shielding plate 4 in a watertight manner (to form a cooling chamber 6).

Thus, the body 3 fulfills on its own several functions, namely support of the coil winding(s) 2, 2', 2", support for the shielding plate 4, container for the cooling chamber 6 and also main structural and physical component of the considered RS coil device 1.

The embedded cooling chamber(s) 6 serve(s) simultaneously to evacuate the heat produced by the coil winding(s) 2, 2', 2" (allowing high current density, resulting in compact and high efficiency coils) and to evacuate the heat generated by the Eddy currents in the shielding plate 4 (which is in direct contact with the coolant).

Preferably the cooling means 5 of each coil device 1 (comprising one or several cooling chambers 6) are connected by ducts 7 to an existing cooling circuit or equipment, or to a specific and independent cooling circuit comprising an adapted cooling unit, for example a low pressure heat exchanger 7' (see FIG. 1).

As shown in FIGS. 2 to 4, 6 and 7, the support, shielding and cooling means 3, 4, 5, as well as the windings 2, 2', 2", of each coil device 1 are configured and arranged so as to constitute together a plane disc shaped structure, the at least two concentrically arranged circular windings 2, 2', 2" being preferably all mutually coplanar.

The same drawings also illustrate that the volume of the at least one or each annular cooling chamber 6 of each coil device 1 is entirely comprised within the thickness of the disc shaped body 3 and is located between the magnetic field shielding means 4 and the coil winding(s) 2, 2', 2".

According to a preferred construction, each RS coil device 1 comprises at least two physically separated, and mutually concentric, windings 2, 2', 2", said windings 2, 2', 2" being connected in series and each winding 2, 2', 2" being lodged in its own recess 3".

As shown in FIGS. 2 to 4, each RS coil may consist of two concentric windings 2 and 2' or, as shown in FIGS. 6 and 7, of several concentric windings 2, 2' and 2", forming windings of different diameters and radial thicknesses. Of course, an RS coil may also comprise only one winding (not shown).

Advantageously, the coil windings 2, 2', 2" of each coil device 1 comprise at least one main coil winding 2 and at least one secondary coil winding 2', 2". Said at least one annular cooling chamber 6, or at least one main annular cooling chamber, is favorably arranged opposite said at least one main coil winding 2 and has preferably a radial extension similar to that of said at least one main coil winding 2.

This multichamber and actively cooled coil topology allows to minimize impedance and to maximize efficiency and homogeneity, taking also into account the effects of the shielding plate 4.

In accordance with a most favorable construction of the RS coils, the invention proposes that each winding 2, 2', 2" of each coil device 1 is comprised of stacked concentric layers Li of round wire 2'" made of insulated electrically conductive material, arranged in quincunx or in staggered rows between adjacent layers, said wire 2'" preferably consisting of Litz wire.

The specific topology of each coil winding 2, 2', 2", combined with the use of round wire having self-positioning properties (easily repeatable-reproducible production process) and allowing impregnation with epoxy resin (or similar) for high voltage insulation (presence of capillary paths between wires), and also with a specific winding pattern which results in coils having a high filling factor and a minimized wire length between adjacent turns (minimum voltage potential between adjacent turns—high ratio thickness/length), result in a functionally optimized RS coil device 1.

In particular, the linearity of the impedance is maintained at high frequency (low parasitic capacitors) and good mechanical and dielectric strengths are achieved.

When the used wire is Litz wire impregnated by epoxy resin, the impedance can be improved by achieving a greater linearity versus frequency and by minimizing Eddy currents effect.

Most preferably, the solid shielding plate forming the magnetic field shielding means 4 of each coil device 1 is made of a non-magnetic, electrically conductive, metallic material, such as for example copper, and constitutes at least one bulkhead of the at least one cooling chamber 6, preferably a lateral bulkhead closing the cooling chamber(s) volume(s) 3'. Said plate 4 advantageously extends radially, internally and externally, beyond the global radial extension of all the coil windings 2, 2', 2" of the considered coil device 1.

So there is provided a passive shield copper plate 4 with direct cooling and with a radial extension that is sufficient to avoid any magnetic interaction between the RS coil devices 1, the main magnet 10 and the pole pieces 11.

According to a most advantageous embodiment of the invention, the disc shaped support body 3 of each coil device 1 is a one-piece body made of thermally conductive, non-magnetic and electrically insulating material, with a thermal conductivity >10 W/(mK) and a relative permeability≈1, preferably of ceramic material, for example AlN. Said body 3 is advantageously mounted in or on a non-magnetic and electrically insulated surrounding fastening frame 8, for example made of glass reinforced plastic material, connecting rigidly said body 3 to a pole piece 11 of the main field magnet 10 (see FIGS. 2 to 4).

In order to satisfy the mechanical requirements of the inventive RS coil device 1, the ceramic material of the body 3 has a Young modulus between 100 and 500 GPa, preferably between 150 and 300 GPa. The use of a frame 8 acting as a mounting interface allows to reduce the overall dimension of the body 3 made of ceramic material.

As illustrated more specifically in FIGS. 4, 6 and 7, said ceramic support body 3 shows, on one side, an annular groove 3' constituting in cooperation with the metallic plate 4, forming the magnetic field shielding means, a cooling chamber 6 and, on the opposite side, at least one, preferably several concentric radially spaced apart, recess(es) 3" lodging the coil winding(s) 2, 2', 2".

This ceramic body 3 acts as a coil housing and also as a heat exchanger for the windings 2, 2', 2", allowing to thermally decouple the windings from the microwave resonator 12 and also to reduce the noise produced by the Lorentz forces acting on said windings (the body 3 constitutes a stiff support structure).

Additionally, the wall of the body 3 separating the main winding 2 from the cooling chamber 6 is relatively thin so as to achieve an even better heat transfer (FIGS. 4, 6 and 7).

In order to obtain a good electrical insulation, combined with a great mechanical strength within a thin thickness, the coil winding(s) 2, 2', 2" are rigidly encapsulated into their respective recesses 3" by overmoulding/casting (epoxy resin).

As the coolant pressure is preferably kept low, the metallic plate 4 can be advantageously attached to the plate or disc shaped body 3 by gluing.

For maintaining linear impedance at high frequency (minimization of parasitic capacitors), the power cable 16 of each coil device 1 may comprise two spaced apart feeding wires 16' which are twisted around each other, said wires 16' being preferably mounted onto an elongated support body 16" having a helical or twisted structure along the cable 16 (FIG. 9).

In order to be able to use a current source 1''' of reduced costs, in particular an amplifier with limited performances (low output voltage), said current source 1''' driving the coil devices 1 comprises a tuning capacitor network 17.

According to a preferred embodiment of the invention, the microwave resonator 12 comprises a body which has a RF adsorption of less than 5% at an RF frequency between 1 kHz and 200 kHz.

The present invention also encompasses an RS coil device 1 for use in an EPR apparatus 9 as described before, and forming together with a second similar coil device 1, a rapid scan coil assembly 1'.

According to the invention, said coil device 1 comprises:
i) at least one coil winding 2, 2', 2", preferably two physically separated, electrically connected in series and mutually concentric coil windings 2, 2', 2",
ii) coil support means 3 having a plate like body and comprising recesses 3', 3" designed to accommodate the at least one coil winding 2, 2', 2" and at least one cooling chamber 6 volume which is connected to cooling liquid supply channels 7, and
iii) RF shielding means 4 comprising an electrically conducting, non-magnetic, shielding plate which is mounted laterally onto the coil support means 3, between the coil winding(s) 2, 2', 2" and the corresponding pole piece 11 of the main field magnet 10, and contacts said cooling chamber volume 6.

Of course, the invention is not limited to the at least one embodiment described and represented in the accompanying drawings. Modifications remain possible, particularly from the viewpoint of the composition of the various elements or by substitution of technical equivalents without thereby exceeding the field of protection of the invention.

The invention claimed is:

1. An electron paramagnetic resonance (EPR) apparatus comprising:
   a main field magnet having two opposed pole pieces defining an airgap between them;
   a microwave resonator coupled with a microwave guide;
   a sample holder, holding a sample to be analyzed; a current source adapted for use as a coil driver; and
   a rapid scan (RS) coil assembly comprising two opposed RS coil devices each having at least one coil winding, wherein each of the two opposed RS coil devices comprises:
   i) a coil support having a plate like body and recesses that accommodate the at least one coil winding and at least one cooling chamber volume connected to cooling liquid supply channels; and
   ii) an RF shielding comprising an electrically conducting non-magnetic shielding plate that is mounted laterally onto the coil support between the at least one coil winding and a corresponding pole piece of the main field magnet, and that contacts the at least one cooling chamber volume.

2. The EPR apparatus according to claim 1, wherein the at least one coil winding of each of the RS coil devices comprises at least two physically separated, and mutually concentric coil windings, said mutually concentric coil windings being connected in series and each of the mutually concentric coil windings being lodged in its own recess.

3. The EPR apparatus according to claim 1, wherein each of the coil supports has a disc shaped body and wherein each of the cooling chamber volumes consists of a circular or annular recess, closed by the RF shielding in a watertight manner for the corresponding coil support.

4. The EPR apparatus according to claim 2, wherein each of the coil supports, each of the RF shieldings, each of the at least one cooling chamber volumes, each set of the cooling liquid supply channels and the at least one coil winding of each of the RS coil devices are configured and arranged so as to constitute together a plane disc shaped structure, with the at least two mutually concentric coil windings of each of the RS coil devices being mutually coplanar.

5. The EPR apparatus according to claim 1, wherein the at least one cooling chamber volume of each of the RS coil devices is entirely comprised within the body of the corresponding coil support and is located between the shielding plate and the at least one coil winding of the respective RS coil device.

6. The EPR apparatus according to claim 1, wherein each of the coil windings of each of the RS coil devices is comprised of stacked concentric layers of round wire made of insulated electrically conductive material, arranged in quincunx or in staggered rows between adjacent layers.

7. The EPR apparatus according to claim 1, wherein the shielding plate of each of the RS coil devices is made of a non-magnetic electrically conductive metallic material, and constitutes at least one bulkhead of the at least one cooling chamber of the respective RS coil device, said plate extending radially, internally and externally, beyond a global radial extension of all the coil windings of its respective coil device.

8. The EPR apparatus according to claim 1, wherein the coil support body of each of the RS coil devices is a one-piece body made of thermally conductive non-magnetic and electrically insulating material, with a thermal conductivity greater than 10 W/(mK) and a relative permeability approximately equal to 1, mounted to a non-magnetic and electrically insulated surrounding fastening frame that rigidly connects the coil support body to the corresponding pole piece of the main field magnet.

9. The EPR apparatus according to claim 8, wherein the coil support body material is a ceramic material having a Young modulus between 100 and 500 GPa.

10. The EPR apparatus according to claim 9, wherein the ceramic support body of each of the RS coil devices comprises on one side, an annular groove that is closed by the shielding plate for the respective RS coil device to form the cooling chamber volume of the corresponding ceramic support body and, on the opposite side, at least one recess in which the at least one coil winding of the respective RS coil device is lodged.

11. The EPR apparatus according to claim 1, wherein each of the coil windings is rigidly encapsulated in a respective recess by overmoulding or casting, and wherein each of the shielding plates is attached to the body of the respective coil support by gluing.

12. The EPR apparatus according to claim 1, further comprising a power cable for each of the RS coil devices that comprises two spaced apart feeding wires twisted around each other, said wires being mounted onto an elongated cable support body having a helical or twisted structure along the power cable.

13. The EPR apparatus according to claim 1, wherein the current source comprises a tuning capacitor network.

14. The EPR apparatus according to claim 1, wherein the microwave resonator comprises a body that has a RF adsorption of less than 5% at an RF frequency between 1 kHz and 200 kHz.

15. A first coil device and a second coil device comprising a rapid scan coil assembly for an electron paramagnetic resonance (EPR) apparatus having a main field magnet with two opposed pole pieces defining an airgap between them, a microwave resonator coupled with a microwave guide, sample holder holding a sample to be analyzed, and a current source adapted for use as a coil driver, said first and second coil devices each comprising:
    i) at least one coil winding;
    ii) a coil support having a plate like body and recesses that accommodate the at least one coil winding and at least one cooling chamber volume connected to cooling liquid supply channels; and iii) an RF shielding comprising an electrically conducting non-magnetic shielding plate that is mounted laterally onto the coil support between the at least one coil winding and a corresponding pole piece of the main field magnet, and that contacts said cooling chamber volume.

\* \* \* \* \*